United States Patent
Ahmad (10) Patent No.: US 8,638,166 B2
(45) Date of Patent: Jan. 28, 2014

(54) APPARATUS AND METHODS FOR NOTCH FILTERING

(75) Inventor: Fazil Ahmad, Santa Clara, CA (US)

(73) Assignee: Analog Devices, Inc., Norwood, MA (US)

( * ) Notice: Subject to any disclaimer, the term of this patent is extended or adjusted under 35 U.S.C. 154(b) by 45 days.

(21) Appl. No.: 13/495,895

(22) Filed: Jun. 13, 2012

(65) Prior Publication Data

US 2013/0335144 A1    Dec. 19, 2013

(51) Int. Cl.
  *H03F 1/02* (2006.01)
(52) U.S. Cl.
  USPC .............................................. 330/9; 327/124
(58) Field of Classification Search
  USPC .................. 330/9, 69, 252; 327/124, 307
  See application file for complete search history.

(56) References Cited

U.S. PATENT DOCUMENTS

| | | | |
|---|---|---|---|
| 7,292,095 B2 | 11/2007 | Burt et al. | |
| 7,456,684 B2 * | 11/2008 | Fang et al. | 330/9 |
| 7,518,440 B1 * | 4/2009 | Trifonov | 330/9 |
| 7,535,295 B1 | 5/2009 | Huijsing et al. | |
| 7,724,080 B2 * | 5/2010 | Luff | 330/9 |
| 7,764,118 B2 | 7/2010 | Kusuda et al. | |
| 8,099,073 B1 * | 1/2012 | Muller et al. | 455/296 |
| 8,179,195 B1 * | 5/2012 | Huijsing et al. | 330/9 |

OTHER PUBLICATIONS

Bilotti et al., *Chopper-Stabilized Amplifiers With a Track-and-Hold Signal Demodulator*, Allegro MicroSystems, Inc., 8 pages (Apr. 1999).
Wu et al., *A Chopper Current-Feedback Instrumentation Amplifier with a 1mHz 1/f Noise Corner and an AC-Coupled Ripple-Reduction Loop*, ISSCC 2009/Session 19/ Analog Techniques/19.1, 2009 IEEE International Solid-State Circuits Conference, 3 pages (Feb. 2009).

* cited by examiner

*Primary Examiner* — Henry Choe
(74) *Attorney, Agent, or Firm* — Knobbe Martens Olson & Bear LLP (57) ABSTRACT

Apparatus and methods for notch filtering are provided. In certain implementations, an amplifier includes amplification stages for providing signal amplification, chopper circuitry for generating a chopped signal by chopping an amplified signal associated with the amplification stages at a chopping frequency, and a time-interleaved finite impulse response (FIR) notch filter for notching frequency components of the chopped signal near the chopping frequency. The time-interleaved FIR notch filter includes a plurality of FIR filters configured to sample the chopped signal at a sampling rate of about twice the chopping frequency. The FIR filters are interleaved in time to reduce sampling error. Additionally, the time-interleaved FIR notch filter includes an infinite impulse response (IIR) filter configured to average samples taken by respective ones of the FIR filters and to integrate the averaged samples to generate the time-interleaved FIR notch filter's output signal.

13 Claims, 10 Drawing Sheets

APPARATUS AND METHODS FOR NOTCH FILTERING

BACKGROUND

1. Field

Embodiments of the invention relate to electronic devices, and more particularly, to notch filters.

2. Description of the Related Technology

An amplifier, such as an operational amplifier, can include chopper circuitry and a notch filter to help reduce the amplifier's input offset voltage. For example, the amplifier can include a first chopping circuit used to periodically swap or chop the positive and negative inputs of the amplifier's input stage at a chopping frequency and a second chopping circuit used to periodically swap or chop the positive and negative outputs of the amplifier's input stage at the chopping frequency. Additionally, a notch filter can be used to generate a notched signal by attenuating frequency components of the second chopping circuit's output signal that are at the chopping frequency. Thereafter, the notched signal can be amplified to generate the amplifier's output signal.

The second chopping circuit can operate to upshift the input offset voltage of the amplifier's input stage from DC to the chopping frequency where it can be attenuated by the notch filter. Since the frequency spectrum of the input signal can be upshifted by the first chopping circuit and downshifted by the second chopping circuit, the input signal can pass through the notch filter without attenuation.

Although configuring the amplifier to include the chopper circuitry and the notch filter can reduce the amplifier's input offset voltage, mismatch error in the notch filter can result in the amplifier nevertheless having offset and/or the amplifier's output signal having ripples at the chopping frequency and at harmonics thereof.

There is a need for notch filters having improved performance. Additionally, there is need for chopper-stabilized amplifiers having reduced input offset voltage and/or reduced output voltage ripple.

SUMMARY

In one embodiment, an amplifier includes a plurality of amplification stages configured to amplify a differential input voltage signal to generate an output signal, a chopper block configured to chop an amplified differential signal associated with the plurality of amplification stages at a chopping frequency to generate a chopped signal, and a notch filter configured to attenuate the chopped signal at the chopping frequency to generate a notched signal. The notch filter includes a first finite impulse response (FIR) filter configured to sample the chopped signal to generate a first plurality of samples as an output, a second FIR filter configured to sample the chopped signal to generate a second plurality of samples as an output, and an infinite impulse response (IIR) filter configured to generate the notched signal at least in part by integrating the output of the first FIR filter and the output of the second FIR filter. At least of portion of the first plurality of samples are interleaved in time with respect to the second plurality of samples.

In another embodiment, a notch filter includes a first FIR filter configured to periodically sample an input signal to generate a first plurality of samples as an output, a second FIR filter configured to periodically sample the input signal to generate a second plurality of samples as an output, and an IIR filter configured to generate an output signal at least in part by integrating the output of the first FIR filter and the output of the second FIR filter. At least of portion of the first plurality of samples are interleaved in time with respect to the second plurality of samples.

In another embodiment, a method of filtering is provided. The method includes generating a first plurality of samples of an input signal using a first FIR filter, generating a second plurality of samples of the input signal using a second FIR filter, averaging the first plurality of samples during a first clock signal phase to generate a first averaged sample, integrating the first averaged sample onto an integration capacitor of an IIR filter during the first clock signal phase, averaging the second plurality of samples during a second clock signal phase to generate a second averaged sample, and integrating the second averaged sample onto the integration capacitor during the second clock signal phase. At least of portion of the first plurality of samples are interleaved in time with respect to the second plurality of samples.

DETAILED DESCRIPTION OF EMBODIMENTS

The following detailed description of certain embodiments presents various descriptions of specific embodiments of the invention. However, the invention can be embodied in a multitude of different ways as defined and covered by the claims. In this description, reference is made to the drawings where like reference numerals indicate identical or functionally similar elements.

Apparatus and methods for notch filtering are provided. In certain implementations, an amplifier includes amplification stages for providing signal amplification, chopper circuitry for generating a chopped signal by chopping an amplified signal associated with the amplification stages at a chopping frequency, and a time-interleaved finite impulse response (FIR) notch filter for notching frequency components of the chopped signal near the chopping frequency. The time-interleaved FIR notch filter includes a plurality of FIR filters configured to sample the chopped signal at a sampling rate about equal to twice the chopping frequency. The sampling of the FIR filters is time-interleaved to reduce sampling error. Additionally, the time-interleaved FIR notch filter includes an infinite impulse response (IIR) filter configured to average and integrate the samples taken by the FIR filters to generate the output signal of the time-interleaved FIR notch filter. In one embodiment, the FIR filters and the IIR filter are implemented in the analog domain. In certain implementations, the time-interleaved FIR notch filter is disposed in the amplifier's main signal path. However, in other implementations, the time-interleaved FIR notch filter is provided in a feedback and/or feed-forward configuration.

Figure 1:
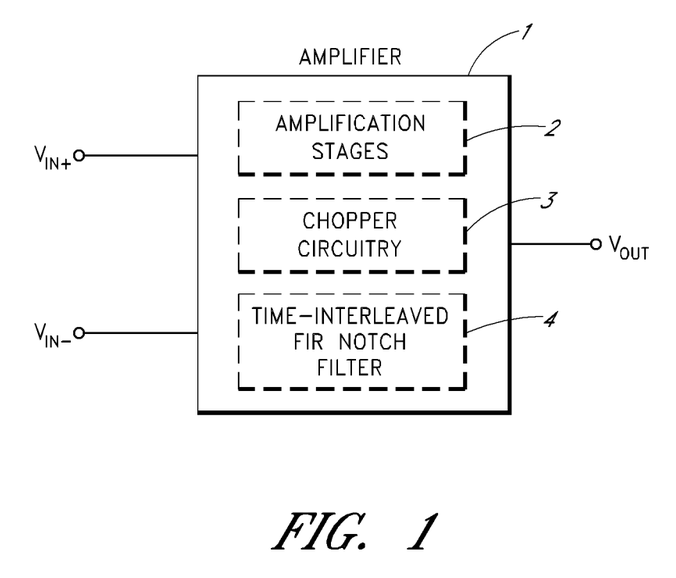
FIG. 1 is a schematic block diagram illustrating one embodiment of an amplifier.

FIG. 1 is a schematic block diagram illustrating one embodiment of an amplifier 1. The amplifier 1 includes amplification stages 2, chopper circuitry or a chopper block 3, and a time-interleaved FIR notch filter 4. The amplifier 1 includes a positive or non-inverted input voltage terminal $V_{IN+}$, a negative or inverted input voltage terminal $V_{IN-}$, and an output voltage terminal $V_{OUT}$.

The amplifier 1 can receive a differential input voltage signal between the positive and negative input voltage terminals $V_{IN+}$, $V_{IN-}$, and can amplify the differential input voltage signal using the amplification stages 2 to generate an output voltage signal on the output voltage terminal $V_{OUT}$. Although FIG. 1 illustrates a configuration in which the amplifier 1 generates a single-ended output voltage signal, the amplifier 1 can be adapted to generate other output signals, including, for example, a differential output voltage signal and/or a single-ended or differential output current signal. Additionally, although FIG. 1 illustrates the amplifier 1 in an open-loop configuration, the amplifier 1 can be used in closed-loop implementations.

The amplification stages 2 can include multiple amplification circuits or stages used to achieve a desired overall gain and performance of the amplifier 1. For example, the amplifier 1 can be configured to have a gain about equal to the product of the gain of each amplification circuit of the amplification stages 2. The use of multiple amplification circuits can also aid in increasing the input impedance and/or reducing the output impedance of the amplifier 1 relative to an amplifier that uses a single stage.

The chopper circuitry 3 can be used to provide chopping to the amplifier 1 to help reduce error in the output voltage signal associated with the amplifier's input offset voltage. As used herein, input offset voltage can refer to a DC voltage between the positive and negative input voltage terminals $V_{IN+}$, $V_{IN-}$ that corresponds to an output voltage of about 0V. The chopper circuitry 3 can be used to regularly reverse the polarity of the differential input voltage signal received between the positive and negative input voltage terminals $V_{IN+}$, $V_{IN-}$ provided to the amplification stages 2. To maintain the signal polarity of the amplifier's output signal, the chopper circuitry 3 can also be used to chop an amplified differential signal of the amplification stages 2, such as positive and negative outputs from one of the amplification circuits associated with the amplification stages 2.

The amplifier 1 further includes the time-interleaved finite impulse response (FIR) notch filter 4, which can be used to reduce or remove the amplifier's input offset voltage error. The time-interleaved FIR notch filter 4 includes a plurality of FIR filters and an infinite impulse response (IIR) filter, and can be used to attenuate a chopped signal generated by chopper circuitry 3 at the chopping frequency. For example, each FIR filter can sample the chopped signal at a sampling rate of about twice the chopping frequency, and the IIR filter can be configured to average samples taken by the FIR filters and to integrate the averaged samples to generate the output of the time-interleaved FIR notch filter. The sampling of the FIR filters can be time-interleaved such that the chopped signal can be sampled even when the IIR filter is averaging and integrating the samples associated with a particular FIR filter. As will be described below with respect to FIGS. 4A-4D, the time-interleaved FIR notch filter 4 can be used in a variety of different configurations, including implementations in which the time-interleaved FIR notch filter 4 is disposed in the amplifier's signal path and configurations in which the time-interleaved FIR notch filter 4 is used in a feed-forward and/or feedback offset correction path.

Figure 2A:
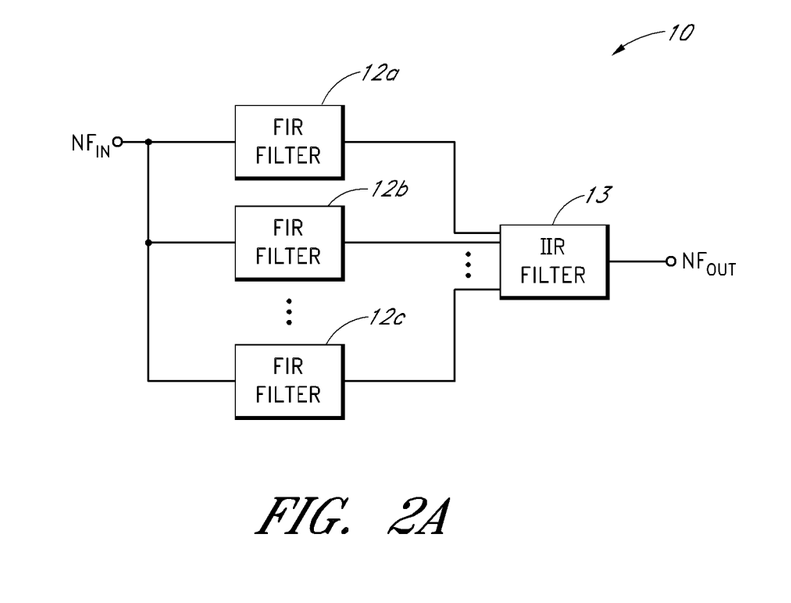
FIG. 2A is a schematic block diagram illustrating one embodiment of a notch filter.

FIG. 2A is a schematic block diagram illustrating one embodiment of a time-interleaved FIR notch filter or notch filter 10. The notch filter 10 includes a first FIR filter 12a, a second FIR filter 12b, a third FIR filter 12c, and an IIR filter 13. Although FIG. 2A illustrates a configuration of the notch filter 10 using three FIR filters 12a-12c, more or fewer FIR filters can be included to aid in achieving a desired sampling error. For example, the notch filter 10 can include two FIR filters or four or more FIR filters.

The notch filter 10 includes an input terminal $NF_{IN}$ and an output terminal $NF_{OUT}$. The input terminal $NF_{IN}$ is electrically connected to an input of the first FIR filter 12a, to an input of the second FIR filter 12b, and to an input of the third FIR filter 12c. The output terminal $NF_{OUT}$ is electrically connected to an output of the IIR filter 13. The IIR filter 13 further includes a first input electrically connected to an output of the first FIR filter 12a, a second input electrically connected to an output of the second FIR filter 12b, and a third input electrically connected to an output of the third FIR filter 12c.

The input terminal $NF_{IN}$ can receive a notch filter input signal, such as a chopped signal generated by a chopper circuit of an amplifier. The notch filter 10 can attenuate frequency components of the notch filter input signal at a notching frequency $F_{NOTCH}$ to generate a notch filter output signal on the output terminal $NF_{OUT}$. In certain implementations, the notch filter input signal is a chopped signal generated by an amplifier's chopper circuit and the notching frequency $F_{NOTCH}$ is selected to be about equal to the chopping frequency used to generate the chopped signal.

A FIR filter can have an impulse response function that is of a finite duration, while an IIR filter can have an impulse response function that may be of infinite duration, such as a decaying exponential response function associated with integrating charge onto a capacitor. In certain implementations, the FIR filters 12a-12c each generate an output signal that is a weighted sum of a finite number of previous values or samples of the notch filter input signal. For example, the FIR filters 12a-12c can each be configured to generate an output signal that is an average of samples of the notch filter input signal taken at a sampling rate of about twice the notching frequency $F_{NOTCH}$.

Sampling an input signal and averaging the samples to generate an output signal can operate to attenuate frequency components of the input signal that have a frequency of about half the sampling frequency. For example, a notch filter configured to generate an output signal that is a moving average of samples taken from an input signal can have a transfer function zero at a frequency of about $F_{SAMPLE}/2$, where $F_{SAMPLE}$ is the sampling frequency.

The first to third FIR filters 12a-12c can be time-interleaved and configured to sample the notch filter input signal at about twice the notching frequency $F_{NOTCH}$ to generate samples. In certain implementations the IIR filter 13 is configured to average samples taken by respective ones of the first to third FIR filters 12a-12c and to integrate the averaged samples to generate the notch filter output signal. By using the FIR filters 12a-12c to sample at twice the notching frequency $F_{NOTCH}$ and by using the IIR filter 13 to average and integrate the samples, the time-interleaved FIR notch filter 10 can generate a notch filter output signal having attenuated frequency components at the notching frequency $F_{NOTCH}$. Additionally, by time-interleaving the FIR filters 12a-12c, the notch filter input signal can be sampled even when the IIR filter 13 is averaging and integrating the samples associated with a particular one of the FIR filters 12a-12c. Thus, the notch filter 10 can have reduced sampling error.

The notch filter 10 can be configured to have any suitable stop-band, such as stop band that attenuates signals that are within about +/−10% of the notching frequency $F_{NOTCH}$ by at least about 40 dB. In certain implementations, the time-interleaved FIR notch filter 10 can be configured to substantially pass signals having a frequency outside of the stop band without attenuation. Although one example of signal attenuation values has been described, persons having ordinary skill in the art will readily ascertain other suitable attenuation values.

Figure 2B:
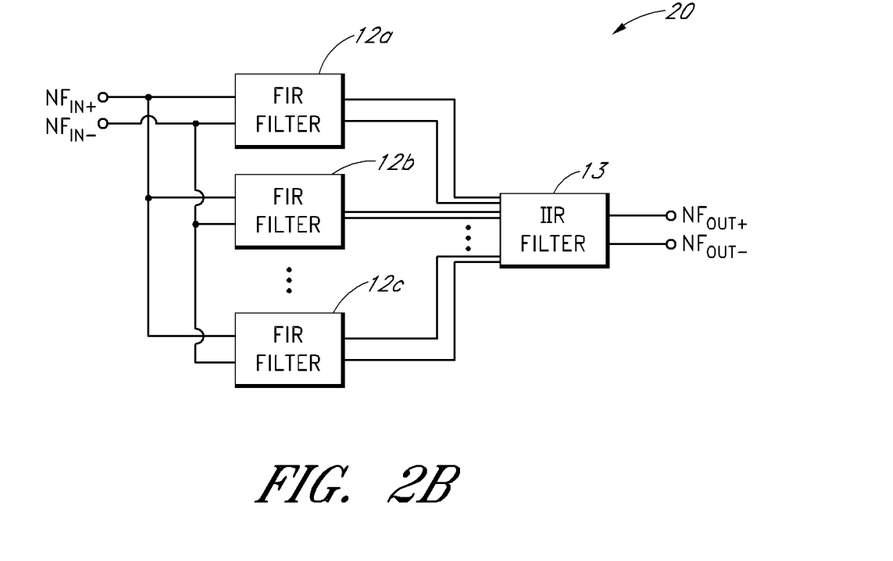
FIG. 2B is a schematic block diagram illustrating another embodiment of a notch filter.

FIG. 2B is a schematic block diagram illustrating another embodiment of a time-interleaved FIR notch filter or notch filter 20. The notch filter 20 includes the first to third FIR filters 12a-12c and the IIR filter 13.

The notch filter 20 of FIG. 2B is similar to the notch filter 10 of FIG. 2A, except that the notch filter 20 of FIG. 2B illustrates a differential implementation of the notch filter 10 of FIG. 2A. For example, the notch filter 20 includes a positive or non-inverted input terminal $NF_{IN+}$, a negative or inverted input terminal $NF_{IN-}$, a positive or non-inverted output terminal $NF_{OUT+}$, and a negative or inverted output terminal $NF_{OUT-}$. The positive and negative input terminals $NF_{IN+}$, $NF_{IN-}$ are electrically connected to a differential input of the first FIR filter 12a, to a differential input of the second FIR filter 12b, and to a differential input of the third FIR filter 12c. The positive and negative output terminals $NF_{OUT+}$, $NF_{OUT-}$ are electrically connected to a differential output of the IIR filter 13. The IIR filter 13 further includes a first differential input electrically connected to a differential output of the first FIR filter 12a, a second differential input electrically connected to a differential output of the second FIR filter 12b, and a third differential input electrically connected to a differential output of the third FIR filter 12c. Additional details of the notch filter 20 of FIG. 2B can be similar to those described above with reference to the notch filter 10 of FIG. 2A.

Figure 3A:
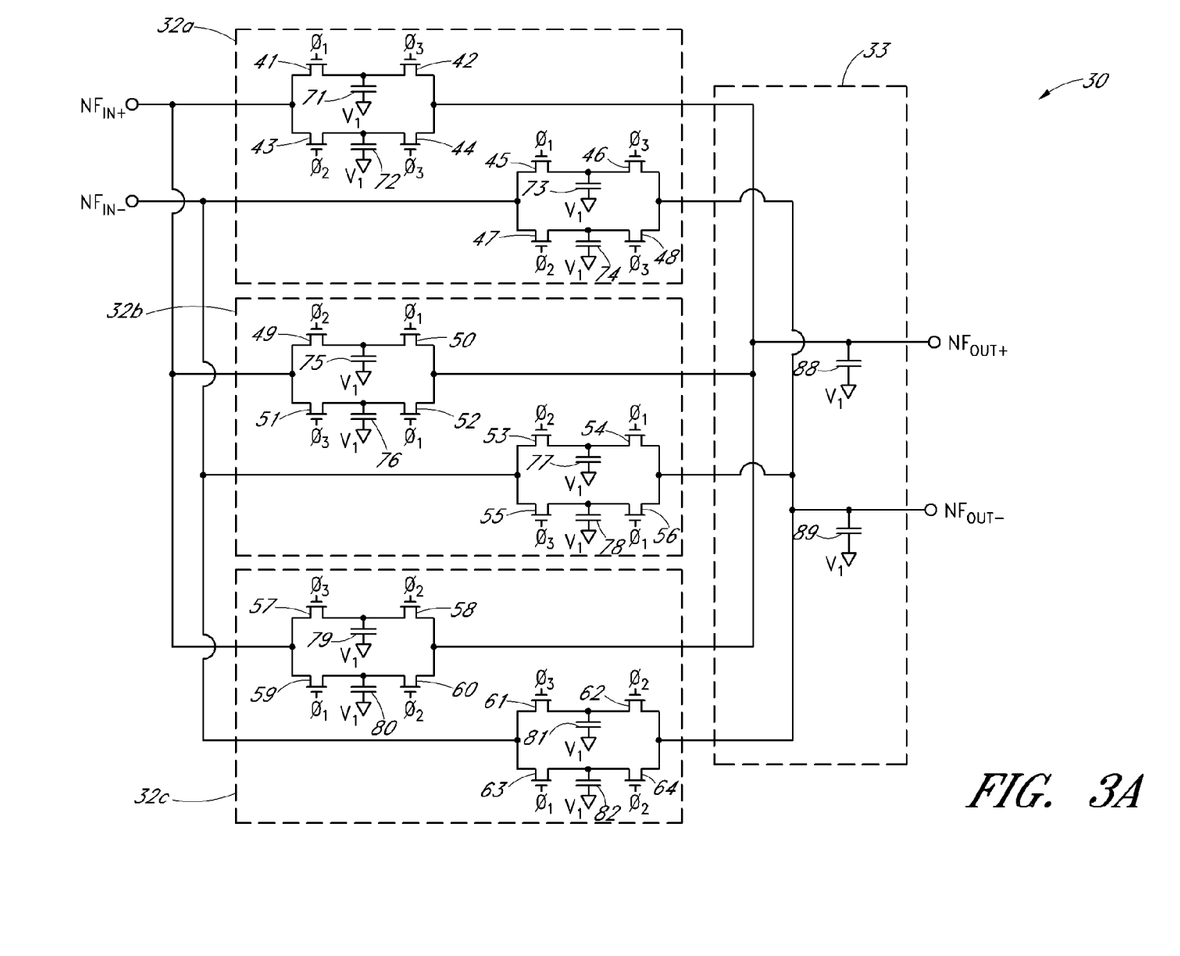
FIG. 3A is a circuit diagram illustrating one embodiment of a notch filter.

FIG. 3A is a circuit diagram illustrating one embodiment of a time-interleaved FIR notch filter or notch filter 30. The notch filter 30 includes a first FIR filter 32a, a second FIR filter 32b, a third FIR filter 32c, and an IIR filter 33. The notch filter 30 further includes a positive input terminal $NF_{IN+}$, a negative input terminal $NF_{IN-}$, a positive output terminal $NF_{OUT+}$, and a negative output terminal $NF_{OUT-}$. Although FIG. 3A illustrates a configuration using three FIR filters, the notch filter 30 can be adapted to include more or fewer FIR filters. Configuring the notch filter 30 to include additional FIR filters can aid in reducing the notch filter's settling time, thereby helping to improve phase margin and/or stability when the notch filter 30 is used in a closed-loop configuration.

The first FIR filter 32a includes first to eighth n-type metal oxide semiconductor (NMOS) transistors 41-48 and first to fourth sampling capacitors 71-74. The second FIR filter 32b includes ninth to sixteenth NMOS transistors 49-56 and fifth to eighth sampling capacitors 75-78. The third FIR filter 32c includes seventeenth to twenty-fourth NMOS transistors 57-64 and ninth to twelfth sampling capacitors 79-82. The IIR filter 33 includes a first integration capacitor 88 and a second integration capacitor 89. As used herein and as persons having ordinary skill in the art will appreciate, MOS transistors can have gates made out of materials that are not metals, such as poly silicon, and can have dielectric regions implemented not just with silicon oxide, but with other dielectrics, such as high-k dielectrics. Additionally, although FIG. 3A illustrates a configuration of the FIR filters that uses NMOS transistors, the FIR filters can be implemented in all or part using other transistor structures, including, for example, p-type metal oxide semiconductor (PMOS) transistors.

The positive input terminal $NF_{IN+}$ is electrically connected to a source of each of the first, third, ninth, eleventh, seventeenth, and nineteenth NMOS transistors 41, 43, 49, 51, 57, 59. The negative input terminal $NF_{IN-}$ is electrically connected to a source of each of the fifth, seventh, thirteenth, fifteenth, twenty-first, and twenty-third NMOS transistors 45, 47, 53, 55, 61, 63. The positive output terminal $NF_{OUT+}$ is electrically connected to a first end of the first integration capacitor 88 and to a drain of each of the second, fourth, tenth, twelfth, eighteenth, and twentieth NMOS transistors 42, 44, 50, 52, 58, 60. The negative output terminal $NF_{OUT-}$ is electrically connected to a first end of the second integration capacitor 89 and to a drain of each of the sixth, eighth, fourteenth, sixteenth, twenty-second, and twenty-fourth NMOS transistors 46, 48, 54, 56, 62, 64. The first and second integration capacitors 88, 89 each further include a second end electrically connected to a first voltage $V_1$, which can be, for example, a ground or power low supply voltage. The first, fifth, tenth, twelfth, fourteenth, sixteenth, nineteenth, and twenty-third NMOS transistors 41, 45, 50, 52, 54, 56, 59, 63 each include a gate configured to receive a first sampling clock signal phase $\phi_1$ of a sampling clock signal. The third, seventh, ninth, thirteenth, eighteenth, twentieth, twenty-second, and twenty-fourth NMOS transistors 43, 47, 49, 53, 58, 60, 62, 64 each include a gate configured to receive a second sampling clock signal phase $\phi_2$ of the sampling clock signal. The second, fourth, sixth, eighth, eleventh, fifteenth, seventeenth, and twenty-first NMOS transistors 42, 44, 46, 48, 51, 55, 57, 61 each include a gate configured to receive a third sampling clock signal phase $\phi_3$ of the sampling clock signal.

The first NMOS transistor 41 further includes a drain electrically connected to a source of the second NMOS transistor 42 and to a first end of the first sampling capacitor 71. The third NMOS transistor 43 further includes a drain electrically connected to a source of the fourth NMOS transistor 44 and to a first end of the second sampling capacitor 72. The fifth NMOS transistor 45 further includes a drain electrically connected to a source of the sixth NMOS transistor 46 and to a first end of the third sampling capacitor 73. The seventh NMOS transistor 47 further includes a drain electrically connected to a source of the eighth NMOS transistor 48 and to a first end of the fourth sampling capacitor 74. The ninth NMOS transistor 49 further includes a drain electrically connected to a source of the tenth NMOS transistor 50 and to a first end of the fifth sampling capacitor 75. The eleventh NMOS transistor 51 further includes a drain electrically connected to a source of the twelfth NMOS transistor 52 and to a first end of the sixth sampling capacitor 76. The thirteenth NMOS transistor 53 further includes a drain electrically connected to a source of the fourteenth NMOS transistor 54 and to a first end of the seventh sampling capacitor 77. The fifteenth NMOS transistor 55 further includes a drain electrically connected to a source of the sixteenth NMOS transistor 56 and to a first end of the eighth sampling capacitor 78. The seventeenth NMOS transistor 57 further includes a drain electrically connected to a source of the eighteenth NMOS transistor 58 and to a first end of the ninth sampling capacitor 79. The nineteenth NMOS transistor 59 further includes a drain electrically connected to a source of the twentieth NMOS transistor 60 and to a first end of the tenth sampling capacitor 80. The twenty-first NMOS transistor 61 further includes a drain electrically connected to a source of the twenty-second NMOS transistor 62 and to a first end of the eleventh sampling capacitor 81. The twenty-third NMOS transistor 63 further includes a drain electrically connected to a source of the twenty-fourth NMOS transistor 64 and to a first end of the twelfth sampling capacitor 82. The first to twelfth sampling capacitors 71-82 each further include a second end electrically connected to the first voltage $V_1$.

The first to third FIR filters 32a-32c are configured to generate time-interleaved samples of a differential notch filter input signal received between the positive and negative notch filter input terminals $NF_{IN+}$, $NF_{IN-}$. For example, the first FIR filter 32a can sample the differential notch filter input signal onto the first and third sampling capacitors 71, 73 on a falling edge of the first sampling clock signal phase $\phi_1$ and can sample the differential notch filter input signal onto the second and fourth sampling capacitors 72, 74 on a falling edge of the second sampling clock signal phase $\phi_2$. Additionally, the second FIR filter 32b can sample the differential notch filter input signal onto the fifth and seventh sampling capacitors 75, 77 on a falling edge of the second sampling clock signal phase $\phi_2$ and can sample the differential notch filter input signal onto the sixth and eighth sampling capacitors 76, 78 on a falling edge of the third sampling clock signal phase $\phi_3$. Furthermore, the third FIR filter 32c can sample the differential notch filter input signal onto the ninth and eleventh sampling capacitors 79, 81 on a falling edge of the third sampling clock signal phase $\phi_3$ and can sample the differential notch filter input signal onto the tenth and twelfth sampling capacitors 80, 82 on a falling edge of the first sampling clock signal phase $\phi_1$. Accordingly, the illustrated FIR filters 32a-32c can each take a first differential sample and a second differential sample of the differential notch filter input signal for each period of the sampling clock signal. Additionally the samples taken by each of the FIR filters 32a-32c are interleaved or at least partially non-overlapping over time.

The IIR filter 33 can be used to average the first and second differential samples taken by respective ones of the FIR filters 32a-32c and to integrate the averaged samples to generate a differential notch filter output signal between the positive and negative notch filter output terminals $NF_{OUT+}$, $NF_{OUT-}$. For example, the first FIR filter 32a can capture a first differential sample of the notch filter input signal on the falling edge of the first sampling clock signal phase $\phi_1$ and a second differential sample on the falling edge of the second sampling clock signal phase $\phi_2$. During the third sampling clock signal phase $\phi_3$, the IIR filter 33 can average the pair of differential samples taken by the first FIR filter 32a and integrate the averaged differential sample onto the first and second integration capacitors 88, 89. Similarly, during the first sampling clock signal phase $\phi_1$, the IIR filter 33 can average the pair of differential samples taken by the second FIR filter 32b and integrate the averaged samples onto the first and second integration capacitors 88, 89. Furthermore, during the second sampling clock signal phase $\phi_2$, the IIR filter 33 can average the pair of differential samples taken by the third FIR filter 32c and integrate the averaged samples onto the first and second integration capacitors 88, 89.

Although FIG. 3A illustrates one embodiment of the FIR filters and the IIR filter, variations and/or alternative implementations of the FIR filters and/or IIR filter can be used.

Figure 3B:
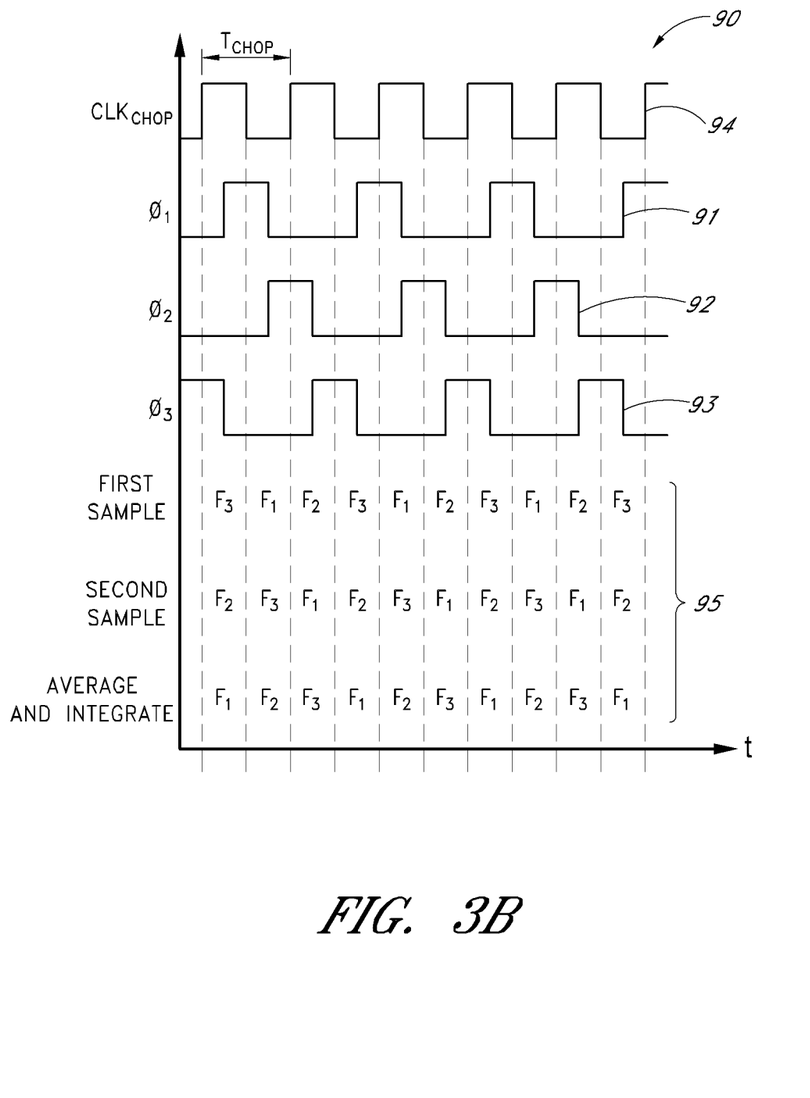
FIG. 3B is a graph illustrating one example of a timing diagram for the notch filter of FIG. 3A.

FIG. 3B is a graph illustrating one example of a timing diagram 90 for the notch filter 30 of FIG. 3A. The timing diagram 90 includes a first plot 91 of the first sampling clock signal phase $\phi_1$, a second plot 92 of the second sampling clock signal phase $\phi_2$, and a third plot 93 of the third sampling clock signal phase $\phi_3$. The timing diagram 90 further includes a fourth plot 94 of a chopping clock signal $CLK_{CHOP}$ used to generate a chopped signal that is provided to the notch filter 30 as the notch filter input signal.

As described earlier, the notch filter 30 of FIG. 3A can capture samples of the notch filter input signal on falling edges of the first to third sampling clock signal phases $\phi_1$-$\phi_3$. Since two falling edges of the sampling clock signal phases $\phi_1$-$\phi_3$ occur for each chopping period $T_{CHOP}$ of the chopping clock signal $CLK_{CHOP}$, the sampling rate of the notch filter 30 is about twice that of the chopping frequency of the chopping clock signal $CLK_{CHOP}$. Additionally, the first and second samples taken by each of the FIR filters 32a-32c can be separated by about half the chopping period $T_{CHOP}$, and the notch filter 30 can have a notching frequency about equal to the chopping frequency of the chopping clock signal $CLK_{CHOP}$.

The timing diagram 90 has been annotated to include filter operational data 95 showing the state of operation of the first to third FIR filters 32a-32c of FIG. 3A over time. For example, the operational data 95 illustrates when the first FIR filter 32a ($F_1$), the second FIR filter 32b ($F_2$), and the third FIR filter 32c ($F_3$), are taking a first sample, taking a second sample, or when the first and second samples are being averaged and integrated by the IIR filter 33. As shown by the filter operational data 95, the notch filter 30 is configured to operate in a time-interleaved fashion in which the timing of the first sample, the second sample, and the average and integrate operation is staggered over time with respect to the first to third FIR filters 32a-32c.

Although FIG. 3B illustrates one example of a timing scheme for the notch filter 30 of FIG. 3A, the notch filter 30 can be configured to operate using other timing configurations. Additionally, although the notch filter 30 is illustrated for a configuration using three FIR filters, the notch filter 30 can be adapted to include more or fewer FIR filters. For example, when using two FIR filters, the notch filter can use two sampling clock signal phases, and when using four FIR filters, the notch filter can use four sampling clock signal phases.

FIGS. 4A-4D are schematic block diagrams illustrating various embodiments of amplifiers.

Figure 4A:
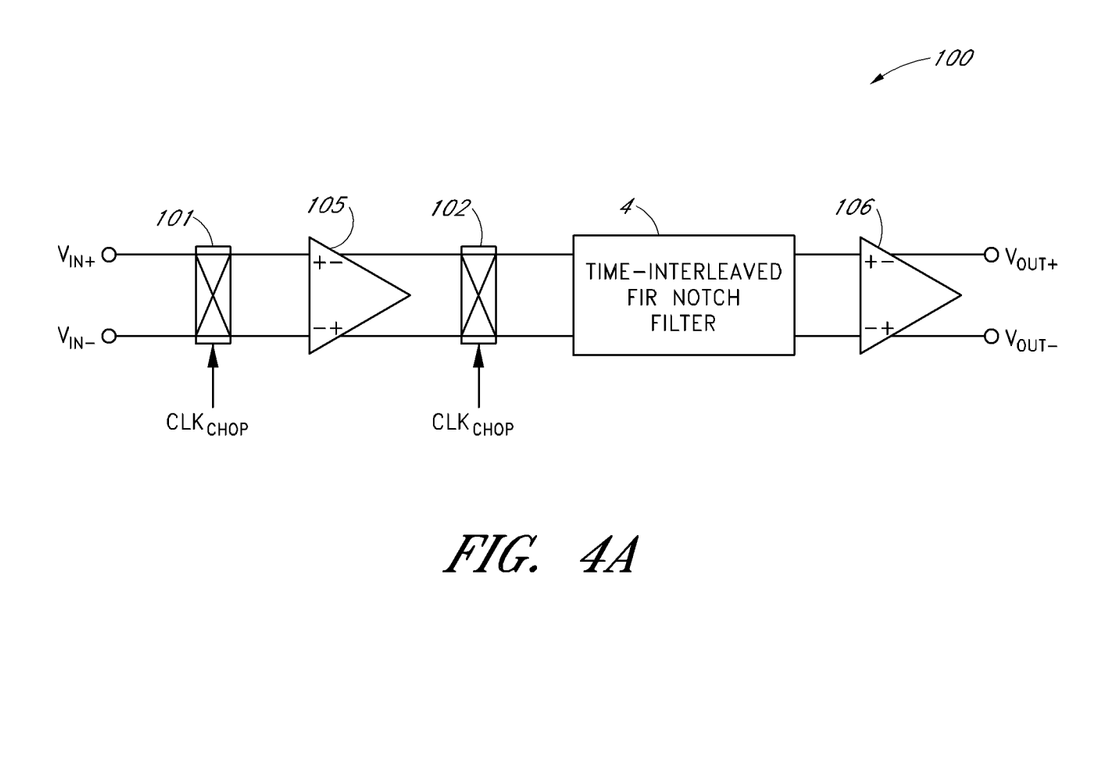
FIGS. 4A-4D are schematic block diagrams illustrating various embodiments of amplifiers.

FIG. 4A is a schematic block diagram of one embodiment of an amplifier 100. The amplifier 100 includes the time-interleaved FIR notch filter or notch filter 4, an input chopping circuit 101, an output chopping circuit 102, a first amplification stage 105, and a second amplification stage 106. The amplifier 100 further includes a positive input voltage terminal $V_{IN+}$, a negative input voltage terminal $V_{IN-}$, a positive output voltage terminal $V_{OUT+}$, and a negative output voltage terminal $V_{OUT-}$.

The input chopping circuit 101 includes a clock input configured to receive a chopping clock signal $CLK_{CHOP}$, a differential input electrically connected to the positive and negative input voltage terminals $V_{IN+}$, $V_{IN-}$, and a differential output electrically connected to a differential input of the first amplification stage 105. The output chopping circuit 102 includes a clock input configured to receive the chopping clock signal $CLK_{CHOP}$, a differential input electrically connected to a differential output of the first amplification stage 105, and a differential output electrically connected to a differential input of the notch filter 4. The second amplification stage 106 includes a differential input electrically connected to a differential output of the notch filter 4 and a differential output electrically connected to the positive and negative output voltage terminals $V_{OUT+}$, $V_{OUT-}$.

The input chopping circuit 101 can be used to chop the differential input of the first amplification stage 5 by periodically swapping or chopping the positive and negative input voltage terminals $V_{IN+}$, $V_{IN-}$ at the chopping frequency of the chopping clock signal $CLK_{CHOP}$. For example, the input chopping circuit 101 can be used to regularly reverse the polarity of the differential input voltage signal received between the positive and negative input voltage terminals $V_{IN+}$, $V_{IN-}$ provided to the first amplification stage 105. Additionally, the output chopping circuit 102 can be used to chop the differential output of the first amplification stage 105. The input chopping circuit 101 can operate to upshift the frequency content or spectrum of the amplifier's input signal by the chopping frequency and the output chopping circuit 102 can operate to downshift the frequency content of the amplifier's input signal by the chopping frequency.

The differential output signal generated by the first amplification stage 105 can have a magnitude near the chopping frequency that is proportional to the input offset voltage of the amplifier 100. For example, in the absence of an input signal to the first amplification stage 105, the differential output signal of the first amplification stage 105 can be a square wave signal with a magnitude proportional to the amplifier's input offset voltage and a frequency about equal to the chopping frequency. Since such a square wave signal can be equivalently represented by a Fourier series of sine waves at the chopping frequency and at odd harmonics thereof, the differential output signal of the first amplification stage 105 near the chopping frequency can have a magnitude that changes in proportion to the input offset voltage of the amplifier 100. The notch filter 4 can notch the differential output signal of the output chopping circuit 102 at the chopping frequency, thereby reducing or removing the amplifier's input offset voltage. However, the amplifier's input signal can be upshifted by the input chopping circuit 101 and downshifted by the output chopping circuit 102, and thus can substantially pass through the notch filter 4 without attenuation.

Figure 4B:
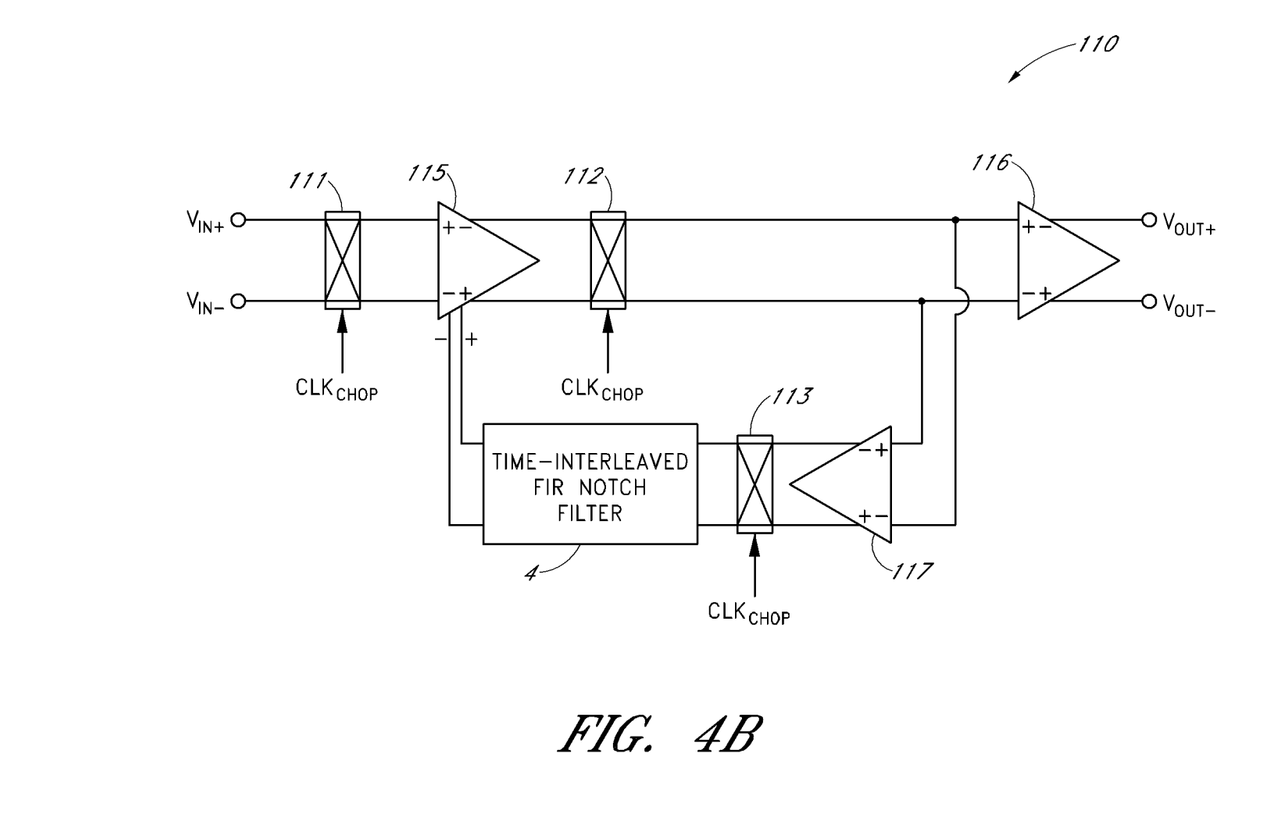

FIG. 4B is a circuit diagram illustrating another embodiment of an amplifier 110. The amplifier 110 includes the notch filter 4, an input chopping circuit 111, an output chopping circuit 112, a feedback chopping circuit 113, a first amplification stage 115, a second amplification stage 116, and a feedback amplification stage 117. The amplifier 110 further includes a positive input voltage terminal $V_{IN+}$, a negative input voltage terminal $V_{IN-}$, a positive output voltage terminal $V_{OUT+}$, and a negative output voltage terminal $V_{OUT-}$.

The input chopping circuit 111 includes a clock input configured to receive a chopping clock signal $CLK_{CHOP}$, a differential input electrically connected to the positive and negative input voltage terminals $V_{IN+}$, $V_{IN-}$, and a differential output electrically connected to a differential input of the first amplification stage 115. The output chopping circuit 112 includes a clock input configured to receive the chopping clock signal $CLK_{CHOP}$, a differential input electrically connected to a differential output of the first amplification stage 115, and a differential output electrically connected to a differential input of the second amplification stage 116 and to a differential input of the feedback amplification stage 117. The second amplification stage 116 further includes a differential output electrically connected to the positive and negative output voltage terminals $V_{OUT+}$, $V_{OUT-}$. The feedback chopping circuit 113 includes a clock input configured to receive the chopping clock signal $CLK_{CHOP}$, a differential input electrically connected to a differential output of the feedback amplification stage 117, and a differential output electrically connected to a differential input of the notch filter 4. The notch filter 4 further includes a differential output electrically connected to a differential offset correction input of the first amplification stage 115.

The amplifier 110 has been configured to include feedback offset correction circuitry consisting of the feedback amplification stage 117, the feedback chopping circuit 113, and the notch filter 4. The differential output signal of the output chopping circuit 112 can be amplified by the feedback amplification stage 117, chopped by the feedback chopping circuit 113, and notched by the notch filter 4 to generate a differential feedback signal that can be used to reduce the amplifier's input offset voltage by suppressing output signal ripples at the chopping frequency that are associated with the amplifier's input offset voltage. In particular, the feedback offset correction circuitry can reduce input offset voltage by using feedback to attenuate frequency components in the amplifier's output signal that are at or near the chopping frequency.

Figure 4C:
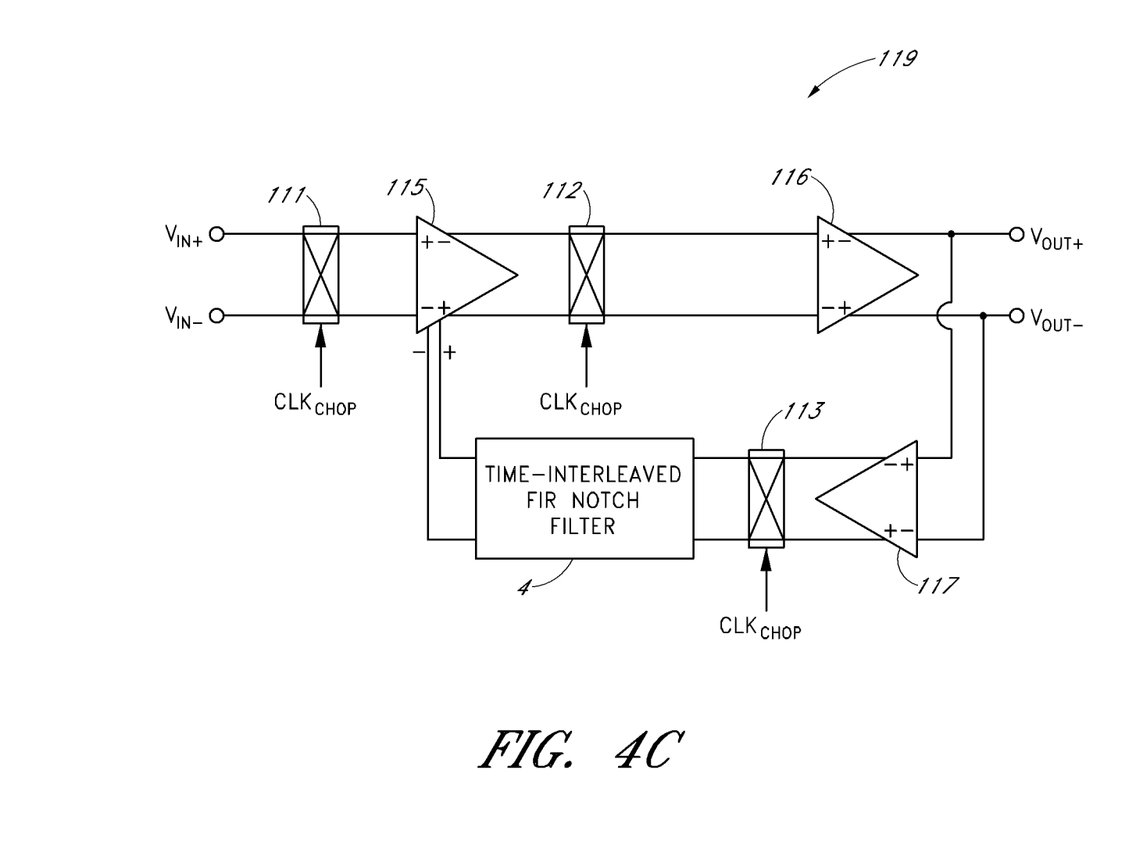

FIG. 4C is a circuit diagram illustrating another embodiment of an amplifier 119. The amplifier 119 includes the notch filter 4, the input chopping circuit 111, the output chopping circuit 112, the feedback chopping circuit 113, the first amplification stage 115, the second amplification stage 116, the feedback amplification stage 117, the positive input voltage terminal $V_{IN+}$, the negative input voltage terminal $V_{IN-}$, the positive output voltage terminal $V_{OUT+}$, and the negative output voltage terminal $V_{OUT-}$. The amplifier 119 of FIG. 4C is similar to the amplifier 110 of FIG. 4B, except that the amplifier 119 illustrates a configuration in which the differential input of the feedback amplification stage 117 is electrically connected to the positive and negative output voltage terminals $V_{OUT+}$, $V_{OUT-}$ rather than to the differential output of the output chopping circuit 112. Additional details of the amplifier 119 of FIG. 4C can be similar to those described earlier with respect to the amplifier 110 of FIG. 4B.

Figure 4D:
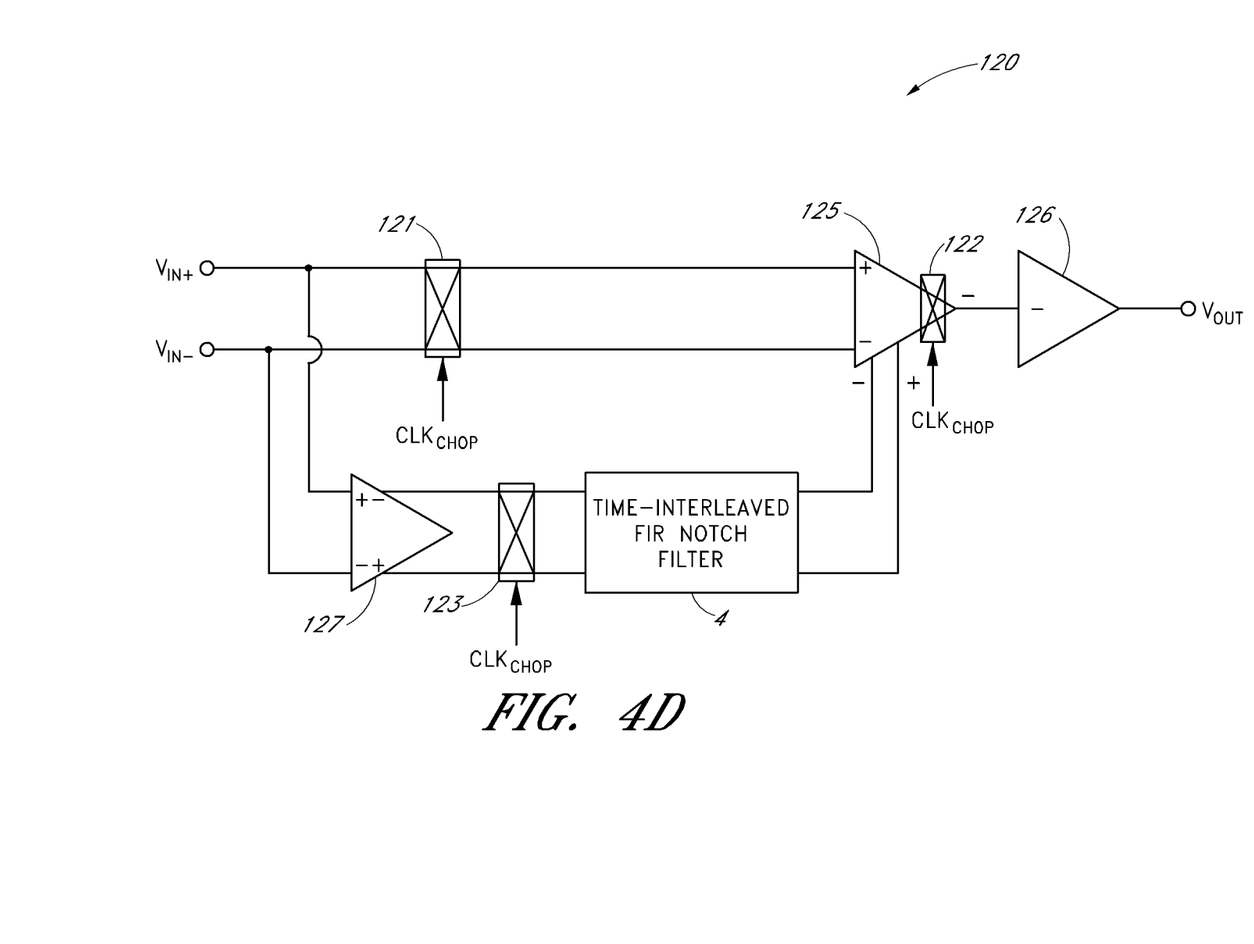

FIG. 4D is a circuit diagram illustrating another embodiment of an amplifier 120. The amplifier 120 includes the notch filter 4, an input chopping circuit 121, an output chopping circuit 122, a feed-forward chopping circuit 123, a first amplification stage 125, a second amplification stage 126, and a feed-forward amplification stage 127. The amplifier 120 further includes a positive input voltage terminal $V_{IN+}$, a negative input voltage terminal $V_{IN-}$, and an output voltage terminal $V_{OUT}$.

The input chopping circuit 121 includes a clock input configured to receive a chopping clock signal $CLK_{CHOP}$, a differential output electrically connected to a differential input of the first amplification stage 125, and a differential input electrically connected to the positive and negative input voltage terminals $V_{IN+}$, $V_{IN-}$ and to a differential input of the feed-forward amplification stage 127. The feed-forward chopping circuit 123 includes a clock input configured to receive the chopping clock signal $CLK_{CHOP}$, a differential input electrically connected to a differential output of the feed-forward amplification stage 127, and a differential output electrically connected to a differential input of the notch filter 4. The notch filter 4 further includes a differential output electrically connected to a differential offset correction input of the first amplification stage 125. The second amplification stage 126 includes an input electrically connected to an output of the first amplification stage 125 and an output electrically connected to the output voltage terminal $V_{OUT}$. In the configuration illustrated in FIG. 4D, the output chopping circuit 122 has been implemented as part of the first amplification stage 125.

When the feed-forward amplification stage 127 does not receive a differential input signal, the differential output signal of the feed-forward amplification stage 127 can correspond to an amplified version of the input offset voltage of the feed-forward amplification stage 127. The feed-forward chopping circuit 123 can chop the differential output signal of the feed-forward amplification stage 127 at the chopping frequency of the chopping clock signal $CLK_{CHOP}$. Thereafter, the notch filter 4 can reduce or attenuate the magnitude of signal components of the output of the feed-forward chopping circuit 123 at the chopping frequency, thereby reducing the magnitude of frequency components associated with input offset voltage of the feed-forward amplification stage 127. By using the notch filter 4 to attenuate or notch the output of the feed-forward chopping circuit 123 at the chopping frequency of the chopping clock signal $CLK_{CHOP}$, the notch filter 4 can be used to generate a feed-forward offset correction signal associated with reduced or removed input offset voltage error.

The first amplification stage 125 can be configured to combine the differential output signal of the notch filter 4 with the differential output signal of the input chopping circuit 121. Since the differential output signal of the notch filter 4 is amplified by the gain of the feed-forward amplification stage 127 before it is combined with the differential output signal of the input chopping circuit 121, the feed-forward offset correction signal generated by the notch filter 4 can be used to substantially control the gain versus frequency response of the amplifier 120 near the chopping frequency. Since the feed-forward offset correction signal can have reduced input offset voltage error, the illustrated feed-forward offset correction scheme can be used to reduce the amplifier's input offset voltage.

Figure 5A:
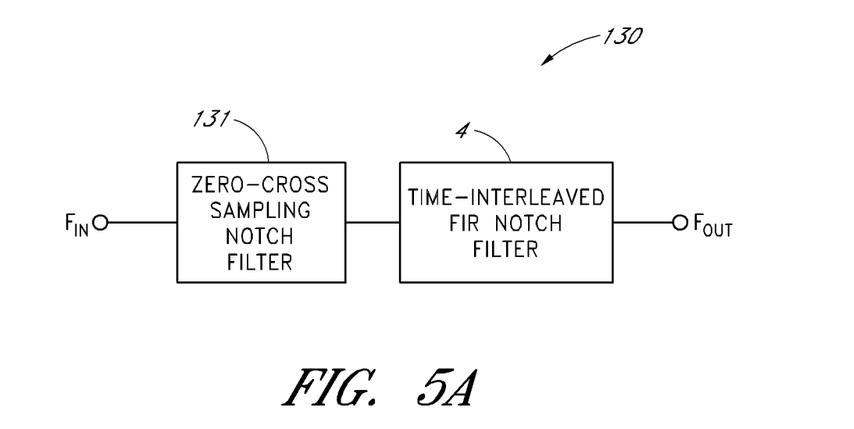
FIG. 5A is a schematic block diagram of another embodiment of a notch filter.

FIG. 5A is a schematic block diagram of another embodiment of a notch filter 130. The notch filter 130 includes a zero-cross sampling notch filter 131 and a time-interleaved FIR notch filter 4. Additionally, the notch filter 130 includes an input terminal $F_{IN}$ and an output terminal $F_{OUT}$. The zero-cross sampling notch filter 131 includes an input electrically connected to the input terminal $F_{IN}$ and an output electrically connected to an input of the time-interleaved FIR notch filter 4. Additionally, the time-interleaved FIR notch filter 4 further includes an output electrically connected to the output terminal $F_{OUT}$.

The notch filter 130 illustrates a scheme in which the zero-cross sampling notch filter 131 and the time-interleaved FIR notch filter 4 have been cascaded between the input terminal $F_{IN}$ and the output terminal $F_{OUT}$. Cascading the notch filters in this manner can be used to provide a notch filter having a stop band that provides a greater attenuation relative to a scheme in which the time-interleaved FIR notch filter 4 or the zero-cross sampling notch filter 131 is used alone. For example, in certain implementations, the notch filter 130 can be configured to attenuate signals at the notching frequency by about $\alpha_1 * \alpha_2$, where $\alpha_1$ is the attenuation of the time-interleaved FIR notch filter 4 at the notching frequency and $\alpha_2$ is the attenuation of the zero-cross sampling notch filter 131 at the notching frequency.

The zero-cross sampling notch filter 131 can generate an output signal by decreasing the slew rate of an input signal provided by a filter and/or sampling network to generate a slewed signal and sampling the slewed signal at about twice the chopping frequency of the chopping clock signal $CLK_{CHOP}$ to generate an output signal. Since a signal having a frequency equal to the chopping frequency can cross a reference voltage periodically at a rate that is about twice the chopping frequency, the zero-cross sampling notch filter 131 can operate to attenuate frequency components of an input signal that are at the chopping frequency. In certain implementations, when notching a chopped signal generated by a chopping circuit, the zero-cross sampling notch filter 131 can be configured to sample the chopped signal using a sampling clock that is about 90° out of phase with the chopping clock signal $CLK_{CHOP}$.

Figure 5B:
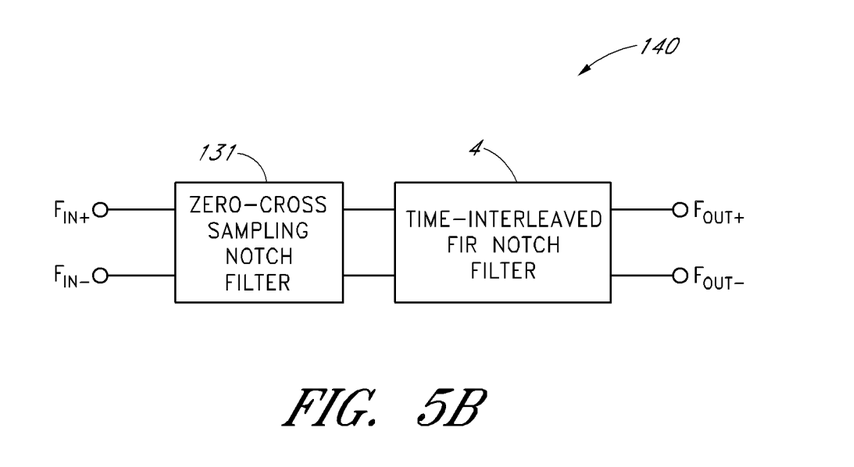
FIG. 5B is a schematic block diagram of another embodiment of a notch filter.

FIG. 5B is a schematic block diagram of another embodiment of a notch filter 140. The notch filter 140 includes the zero-cross sampling notch filter 131 and the time-interleaved FIR notch filter 4.

The notch filter 140 of FIG. 5B is similar to the notch filter 130 of FIG. 5A, except that the notch filter 140 of FIG. 5B illustrates a differential implementation of the notch filter 130 of FIG. 5A. For example, the notch filter 140 includes a positive or non-inverted input terminal $F_{IN+}$, a negative or inverted input terminal $F_{IN-}$, a positive or non-inverted output terminal $F_{OUT+}$, and a negative or inverted output terminal $F_{OUT-}$. The zero-cross sampling notch filter 131 includes a differential input electrically connected to the positive and negative input terminals $F_{IN+}$, $F_{IN-}$, and a differential output electrically connected to a differential input of the time-interleaved FIR notch filter 4. The time-interleaved FIR notch filter 4 further includes a differential output electrically connected to the positive and negative output terminals $F_{OUT+}$, $F_{OUT-}$. Additional details of the notch filter 140 of FIG. 5B can be similar to those described earlier with reference to the notch filter 130 of FIG. 5A.

The notch filters 130, 140 of FIGS. 5A and 5B can be used in accordance with the amplifiers described herein, including, for example, in the amplifiers shown in FIGS. 1 and 4A-4D.

Figure 6:
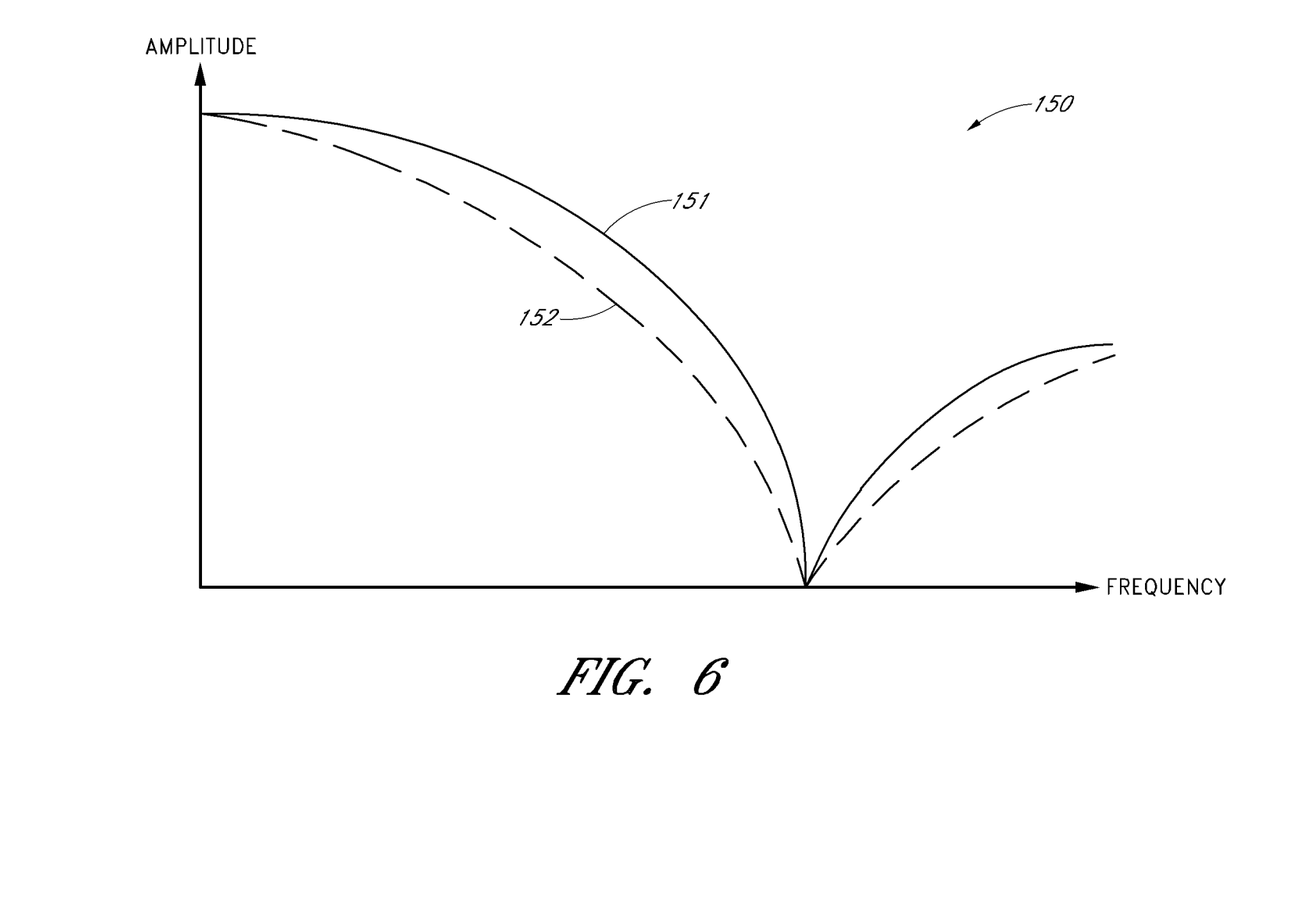
FIG. 6 is a graph of amplitude versus frequency for one example of the notch filter of FIG. 5A.

FIG. 6 is a graph 150 of amplitude versus frequency for one example of the notch filter 130 of FIG. 5A. The graph 150 includes a first plot 151 of amplitude versus frequency for the time-interleaved FIR notch filter 4 and a second plot 152 of amplitude versus frequency for the notch filter 130. As illustrated in FIG. 6, the notch filter 130 can have an amplitude versus frequency response similar to that of a sync-squared filter. Additionally, FIG. 6 illustrates that a cascade of the zero-cross sampling notch filter 131 and the time-interleaved FIR notch filter 4 can provide a wider and deeper stop band relative to a configuration in which the time-interleaved FIR notch filter 4 is used alone.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the Figures depict example arrangements of elements and components, additional intervening elements, devices, features, or components may be present in an actual embodiment (assuming that the functionality of the depicted circuits is not adversely affected).

APPLICATIONS

Devices employing the above described schemes can be implemented into various electronic devices. Examples of the electronic devices can include, but are not limited to, medical imaging and monitoring, consumer electronic products, parts of the consumer electronic products, electronic test equipment, etc. Examples of the electronic devices can also include memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi functional peripheral device, a wrist watch, a clock, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An amplifier comprising:
   a plurality of amplification stages configured to amplify a differential input voltage signal to generate an output signal;
   a chopper block configured to chop an amplified differential signal associated with the plurality of amplification stages at a chopping frequency to generate a chopped signal; and
   a notch filter configured to attenuate the chopped signal at the chopping frequency to generate a notched signal, wherein the notch filter comprises:
      a first finite impulse response (FIR) filter configured to sample the chopped signal to generate a first plurality of samples as an output;
      a second FIR filter configured to sample the chopped signal to generate a second plurality of samples, wherein at least of portion of the first plurality of samples are interleaved in time with respect to the second plurality of samples as an output; and
      an infinite impulse response (IIR) filter configured to generate the notched signal at least in part by integrating the output of the first FIR filter and the output of the second FIR filter.

2. The amplifier of claim 1, wherein the IIR filter is further configured to generate the notched signal by averaging the first plurality of samples and by averaging the second plurality of samples.

3. The amplifier of claim 1, wherein the notch filter further comprises a third FIR filter configured to periodically sample the chopped signal to generate a third plurality of samples as an output, and wherein at least of portion of the third plurality of samples are interleaved in time with respect to the first and second pluralities of samples, and wherein the IIR filter is further configured to generate the notched signal by integrating the output of the third FIR filter.

4. The amplifier of claim 3, wherein the first FIR filter is configured to generate a first sample of the chopped signal during a first sampling phase and to generate a second sample of the chopped signal during a second sampling phase, and wherein the second FIR filter is configured to generate a third sample of the chopped signal during the second sampling phase and to generate a fourth sample of the chopped signal during a third sampling phase, and wherein the third FIR filter is configured to generate a fifth sample of the chopped signal during the third sampling phase and to generate a sixth sample of the chopped signal during the first sampling phase.

5. The amplifier of claim 4, wherein the first FIR filter includes a first sampling capacitor configured to store the first sample and a second sampling capacitor configured to store the second sample, and wherein the second FIR filter includes a third sampling capacitor configured to store the third sample and a fourth sampling capacitor configured to store the fourth sample, and wherein the third FIR filter includes a fifth sampling capacitor configured to store the fifth sample and a sixth sampling capacitor configured to store the sixth sample.

6. The amplifier of claim 5, wherein the IIR filter includes an integration capacitor, and wherein the IIR filter is configured to generate the notched signal based on a voltage across the integration capacitor, and wherein the first FIR filter is configured to electrically connect the first and second sampling capacitors to the integration capacitor during the third sampling phase, and wherein the second FIR filter is configured to electrically connect the third and fourth sampling capacitors to the integration capacitor during the first sampling phase, and wherein the third FIR filter is configured to electrically connect the fifth and sixth sampling capacitors to the integration capacitor during the second sampling phase.

7. The amplifier of claim 1, wherein the first and second pluralities of samples are associated with a sampling rate about equal to twice the chopping frequency.

8. The amplifier of claim 1, wherein the plurality of amplification stages comprises a first amplification stage, and wherein the chopper block comprises an input chopping circuit and an output chopping circuit, and wherein the input chopping circuit is configured to chop the differential input voltage signal at the chopping frequency to generate a chopped differential input signal, and wherein the first amplification stage is configured to amplify the chopped differential input signal to generate the amplified differential signal, and wherein the output chopping circuit is configured to chop the amplified differential signal at the chopping frequency to generate the chopped signal.

9. The amplifier of claim 8, wherein the plurality of amplification stages further includes a second amplification stage configured to amplify the notched signal to generate the output signal.

10. The amplifier of claim 1, wherein the plurality of amplification stages comprises a first amplification stage, and wherein the chopper block comprises an input chopping circuit and an output chopping circuit, and wherein the input chopping circuit is configured to chop the differential input voltage signal at the chopping frequency to generate a chopped differential input signal, and wherein the first amplification stage is configured to combine the chopped differential input signal and the notched signal to generate a combined signal, and wherein the output chopping circuit is configured to chop the combined signal at the chopping frequency to generate a chopped combined signal.

11. The amplifier of claim 10, wherein the plurality of amplification stages further comprises a feed-forward amplification stage, and the chopper block further comprises a feed-forward chopping circuit, and wherein the feed-forward amplification stage is configured to amplify the differential input voltage signal to generate the amplified differential signal, and wherein the feed-forward chopping circuit is configured to chop the amplified differential signal at the chopping frequency to generate the chopped signal.

12. The amplifier of claim 10, wherein the plurality of amplification stages further comprises a feedback amplification stage and the chopper block further comprises a feedback chopping circuit, and wherein the feedback amplification stage is configured to amplify the chopped combined signal to generate the amplified differential signal, and wherein the feedback chopping circuit is configured to chop the amplified differential signal at the chopping frequency to generate the chopped signal.

13. The amplifier of claim 1, wherein the notch filter further comprises a zero-cross sampling filter configured to attenuate the chopped signal at the chopping frequency before the chopped signal is provided to the first and second FIR filters.

* * * * *